United States Patent
Sung et al.

(10) Patent No.: US 11,338,850 B2
(45) Date of Patent: May 24, 2022

(54) METHOD FOR ESTIMATING STEERING WHEEL TORQUE OF VEHICLE

(71) Applicants: Hyundai Motor Company, Seoul (KR); Kia Motors Corporation, Seoul (KR)

(72) Inventors: Woo Je Sung, Yongin-si (KR); Jong Ho Lee, Incheon (KR); Seung Bum Cho, Gwacheon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 610 days.

(21) Appl. No.: 16/123,793

(22) Filed: Sep. 6, 2018

(65) Prior Publication Data
US 2019/0176885 A1  Jun. 13, 2019

(30) Foreign Application Priority Data

Dec. 13, 2017  (KR) .......................... 10-2017-0171116

(51) Int. Cl.
*B62D 6/10* (2006.01)
*G06F 30/17* (2020.01)

(52) U.S. Cl.
CPC ............... *B62D 6/10* (2013.01); *G06F 30/17* (2020.01)

(58) Field of Classification Search
CPC .................................. B62D 6/10; G06F 30/17
See application file for complete search history.

(56) References Cited

U.S. PATENT DOCUMENTS

| 5,904,223 | A | 5/1999 | Shimizu et al. |
| 6,293,366 | B1 | 9/2001 | Chabaan et al. |
| 6,425,454 | B1 | 7/2002 | Chabaan et al. |
| 9,868,464 | B2 * | 1/2018 | Lee ...................... B62D 15/021 |
| 2007/0246290 | A1 * | 10/2007 | Deshmukh .............. G01L 3/104 |
| | | | 180/446 |
| 2010/0268421 | A1 | 10/2010 | Yang et al. |
| 2015/0158524 | A1 | 6/2015 | Lee et al. |
| 2016/0280257 | A1 * | 9/2016 | Miura .................. B62D 5/0481 |
| 2017/0066472 | A1 * | 3/2017 | Wang .................. B62D 5/0463 |
| 2019/0092377 | A1 * | 3/2019 | Shin ......................... H02P 6/16 |

FOREIGN PATENT DOCUMENTS

| CN | 101084144 A | 12/2007 |
| CN | 101898582 A | 12/2010 |
| CN | 102717826 A | 10/2012 |
| CN | 106494499 A | 3/2017 |
| EP | 2364896 A1 | 9/2011 |
| EP | 3184404 A2 | 6/2017 |

(Continued)

*Primary Examiner* — Todd Melton
*Assistant Examiner* — Jason R Roberson
(74) *Attorney, Agent, or Firm* — Slater Matsil, LLP

(57) ABSTRACT

A method of operating a motor vehicle includes sensing a sensed torque based on a driver interaction with a steering wheel that is part of an electric power steering system, the sensed torque being sensed using a torque sensor, calculating driver steering wheel torque using state variables of a steering system model based on the electric power steering system, and controlling a difference between the driver steering wheel torque calculated from the steering system model and sensed torque sensed by the torque sensor to converge to zero through a controller.

11 Claims, 2 Drawing Sheets

(56) References Cited

FOREIGN PATENT DOCUMENTS

| JP | H09156518 A | 6/1997 |
|----|-------------|--------|
| JP | 2017114324 A | 6/2017 |
| KR | 20100074305 A | 7/2010 |
| KR | 20130064542 A | 6/2013 |
| KR | 20170019669 A | 2/2017 |

\* cited by examiner

[FIG. 1]
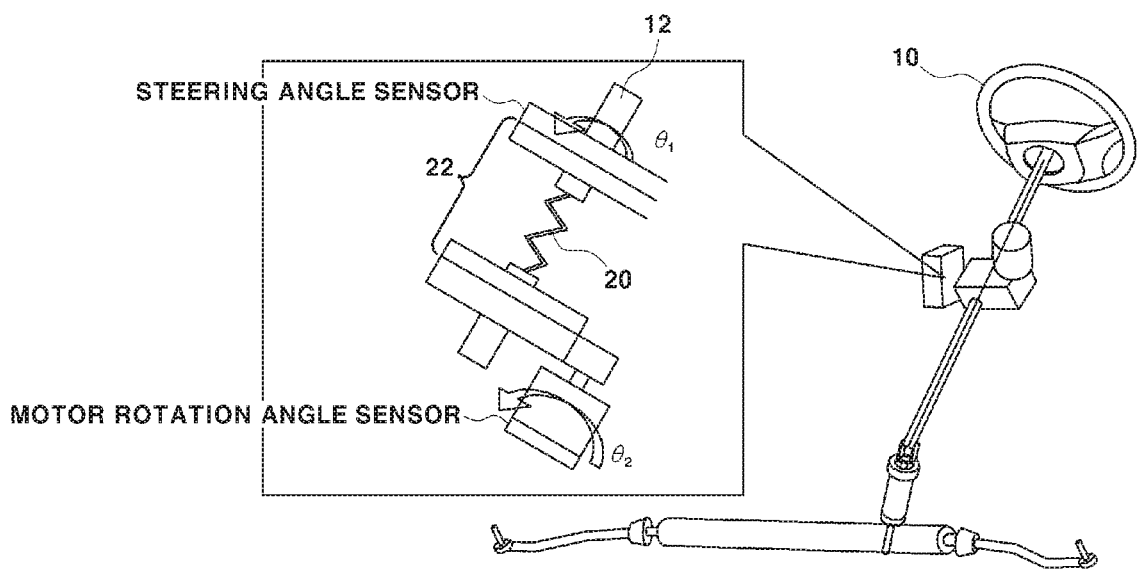
[FIG. 2]
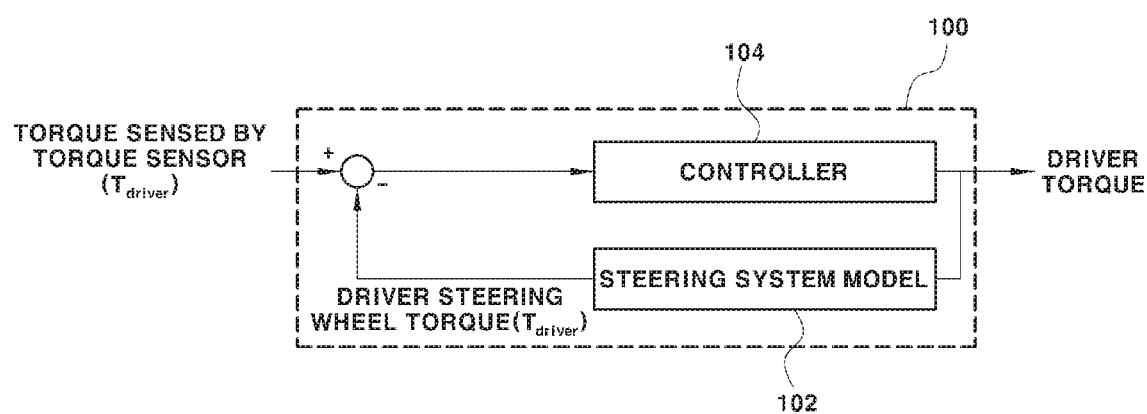

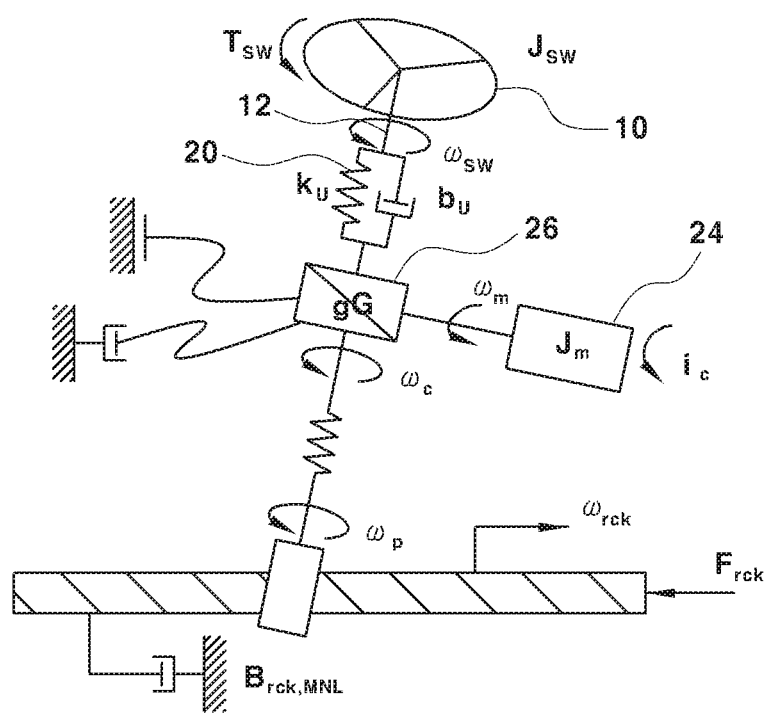
[FIG. 3]

METHOD FOR ESTIMATING STEERING WHEEL TORQUE OF VEHICLE

CROSS-REFERENCE TO RELATED APPLICATIONS

This application claims priority to Korean Patent Application No. 10-2017-0171116, filed on Dec. 13, 2017, which application is hereby incorporated herein by reference.

TECHNICAL FIELD

The present invention relates to a method for estimating steering wheel torque of a vehicle.

BACKGROUND

An electric power steering system (e.g., a motor-driven power steering or MDPS system) is a kind of vehicle speed-sensitive power steering apparatus for changing a steering force on the basis of a driving speed. In this system, an ECU of an electric power steering module provides an optimum steering feeling to a driver by controlling a steering angle and the operation of a motor on the basis of a vehicle speed.

The MDPS system that is an example of the electric power steering system is classified into a column type in which a motor is mounted on a steering column and a rack type in which a motor is mounted on a rack bar connected to a steering shaft.

The electric power steering system calculates the intention of turning a steering wheel (driver torque) by a driver on the basis of a torque sensing value of a torque sensor that senses torque of a torsion bar coupled to a steering column.

For example, as shown in FIG. 1, a torsion bar 20 is coupled to a steering shaft 12 connected to a steering wheel 10 and torque sensors 22 are mounted on the upper end and the lower end of the torsion bar 20. In this configuration, the torque sensors 22 sense torque of the torsion bar 20 and the torque that is used as driver steering wheel torque that is torque applied by a driver to turn the steering wheel.

However, the torque sensing value of the torque sensors based on a nonlinear characteristic of a mechanism and the driver steering wheel torque (the intention of steering of a driver) when the driver actually turns a steering wheel may be different in accordance with the positions of the torque sensors in the electric power steering system. Accordingly, it is difficult to accurately estimate the driver steering wheel torque (the intention of steering of a driver) when controlling the electric power steering system on the basis of the torque sensing signal from the torque sensors. Therefore, the torque sensing value of the torque sensors are unavoidably considered as the driver steering wheel torque and used for controlling various parts of the electric power steering system.

SUMMARY

The present invention relates to a method for estimating steering wheel torque of a vehicle. Particular embodiments relate to a method for estimating steering wheel torque of a vehicle that is able to accurately estimate torque applied by a driver operating a steering wheel in order to improve precision in feedback control of an electric power steering system.

If it is possible to accurately know the driver steering wheel torque that is the torque actually applied by a driver to turn a steering wheel, it is possible to compensate for the driver steering wheel torque more accurately and intuitionally through various control logics of the electric power steering (MDPS) system, and accordingly, it is possible to control performance of the electric power steering (MDPS) system.

Embodiments of the present invention can solve problems and provide a method for estimating steering wheel torque of a vehicle, the method being able to improve the performance of steering a vehicle by precisely assisting an electric power steering system by accurately estimating steering wheel torque (driver's steering intention) in view of the driver through the behavior of the electric power steering system on the basis of the dynamic characteristics of the electric power steering system and a driver model so that the steering wheel torque can be reflected to a feedback control logic of the electric power steering system.

For example, a method for estimating steering wheel torque of a vehicle includes modeling a steering system for designing an electric power steering system; constructing a steering system model for calculating driver steering wheel torque using state variables in the steering system modeling; and controlling a difference between the driver steering wheel torque Tdriver calculated from the steering system model and torque Tsensor sensed by a torque sensor to converge to zero through a controller.

Embodiments of the present invention can provide the following effects.

First, it is possible to precisely assist an electric power steering system by accurately estimating steering wheel torque (driver's steering intention) in view of the driver so that the steering wheel torque can be reflected to a feedback control logic of the electric power steering system.

That is, by replacing driver torque that is a driver feedback signal by not torque sensed by a torque sensor, but a driver effort for directly operating a steering wheel, it is possible to improve the control precision in feedback control of an electric power steering system, and accordingly, it is possible to more precisely assist a steering force.

Second, there may be distortion when sensing torque through a torque sensor due to the weight and inertia of a steering column assembly even if a driver take hands off the steering wheel, but the distortion can be compensated by the driver steering wheel torque estimator of the present invention.

Third, the present invention can be used to determine conditions in which a driver directly operates a steering wheel when developing technologies such as automatic parking, keeping a lane, self-driving on a highway, unmanned self-driving etc.

BRIEF DESCRIPTION OF THE DRAWINGS

The above and other objects, features and other advantages of the present invention will be more clearly understood from the following detailed description when taken in conjunction with the accompanying drawings, in which:

FIG. 1 is a schematic view showing the configuration of an electric power steering system;

FIG. 2 is a view showing a steering wheel torque estimator of a vehicle according to the present invention; and FIG. 3 is a schematic view showing a modeling example of a steering system model for a method for estimating steering wheel torque of a vehicle of the present invention.

DETAILED DESCRIPTION OF ILLUSTRATIVE EMBODIMENTS

Exemplary embodiments of the present invention will be described hereafter in detail with reference to the accompanying drawings.

Embodiments of the present invention can configure a driver torque estimator that estimates actual driver steering wheel torque using state variables of components included in steering system modeling in consideration of a difference between actual driver steering wheel torque $T_{driver}$ when a driver turns a steering wheel and torque $T_{sensor}$ sensed as driver steering wheel torque by a torque sensor so that the difference between the estimated driver steering wheel torque $T_{driver}$ and the $T_{sensor}$ torque sensed by the torque sensor can be used to compensate for target steering torque that is input to a feedback controller of an electric power steering system and the steering force of the electric power steering system can be precisely assisted.

FIG. 2 is a view showing a method for estimating steering wheel torque of a vehicle of the present invention, in which reference numeral '100' indicates a driver torque estimator.

The driver torque estimator converges the difference between driver steering wheel torque estimated from state variables of components in steering system modeling to be described below and torque sensed by a torque sensor to zero.

Referring to FIG. 2, the driver torque estimator 100 includes a steering system model 102 that estimates and output driver steering wheel torque and a controller 104 that performs control for converging the difference between driver steering wheel torque estimated by the steering system model 102 and torque sensed by a torque sensor to zero.

FIG. 3 is a view showing a modeling example of a steering system model for a method for estimating steering wheel torque of a vehicle of the present invention.

First, a steering system for designing an electric power steering system, which includes a steering wheel 10, a 20 torsion bar coupled to a steering shaft 12 connected to the steering wheel 10, a torque sensor (not shown) sensing torque of the torsion bar, a motor 24 and reducer 26 for assisting a steering force that is applied to the steering shaft, etc., is modeled using a bond graph etc.

The state variables of the components in the steering system modeling shown in FIG. 3 are defined as follows.

$J_{sw}$: Inertia of steering wheel
$\omega_{sw}$: Angular speed of steering shaft
$T_{sw}$: Steering wheel torque[=Driver torque ($T_{driver}$)]
$k_u$: Rigidity of torsion bar
$b_u$: Compliance (damping constant) of steering column
$q_u$: Displacement angle (torsion angle) of torsion bar
$P_{sw}$: Change rate of momentum (moment torque) of steering wheel
gG: Gear ratio of reducer
$\omega_m$: Angular speed of motor Next, a steering system model for estimating driver steering wheel torque using the state variables in the steering system modeling is constructed.

To this end, the change rate $P_{sw}$ of momentum of a steering wheel and the displacement angle $q_u$ of a torsion bar are induced as in the following Equations 1 and 2 that are equations of motion made in the steering system modeling.

$$\dot{P}_{sw} = T_{driver} - q_u \cdot k_u - b_u \cdot \frac{P_{sw}}{J_{sw}} + b_u \cdot gG \cdot \omega_m \quad \text{[Equation 1]}$$

In Equation 1, $T_{sw}$ is steering wheel torque [=Driver torque ($T_{driver}$)], $q_u$ is displacement angle (torsion angle) of a torsion bar, $k_u$ is rigidity of the torsion bar, $b_u$ is compliance (damping constant) of a steering column, $J_{sw}$ is inertia of a steering wheel, gG is a gear ratio of a reducer, and $\omega_m$ is an angular speed of a motor.

$$\dot{q}_u = \frac{P_{sw}}{J_{sw}} - gG \cdot \omega_m \quad \text{[Equation 2]}$$

where $P_{sw}$ is a change rate of momentum (moment torque) of a steering wheel, $J_{sw}$ is inertia of a steering wheel, gG is a gear ratio of a reducer, and $\omega_m$ is an angular speed of a motor.

Next, the relationship between the driver steering wheel torque and the torque sensed as the driver steering wheel torque by a torque sensor is derived from Equations 1 and 2 to calculate the driver steering wheel torque, and the relationship can be expressed as the following Equation 3.

$$T_{driver} - q_u \cdot k_u = \dot{P}_{sw} + b_u \left( \frac{P_{sw}}{J_{sw}} + gG \cdot \omega_m \right) \quad \text{[Equation 3]}$$

In Equation 3, $T_{driver}$ is driver steering wheel torque ((=$T_{sw}$), $q_u \cdot k_u$ is torque sensed by a torque sensor, $P_{sw}$ is a change rate of momentum (moment torque) of a steering wheel, $b_u$ is compliance (damping constant) of a steering column, $J_{sw}$ is inertia of the steering wheel, gG is a gear ratio of a reducer, and $\omega_m$ is an angular speed of a motor.

Accordingly, the driver steering wheel torque $T_{driver}$ can be calculated by transposing the torque sensed by a torque sensor in Equation 3.

The driver steering wheel torque $T_{driver}$ is calculated and output by the steering system model 102 of the driver torque estimator 100.

Next, the controller 104 controls the difference between the driver steering wheel torque $T_{driver}$ calculated by the steering system model 102 and the torque sensed by a torque sensor $T_{sensor}$ to converge to zero.

As described above, the controller 104 outputs the driver steering wheel torque with the difference converging to zero such that the driver steering wheel torque is input to the feedback controller of the electric power steering system, whereby it is possible to more precisely assist the steering force of the electric power steering system.

What is claimed is:

1. A method for estimating steering wheel torque of a vehicle, the method comprising:
    modeling a steering system to design an electric power steering system;
    generating a mathematical model that calculates a driver steering wheel torque $T_{driver}$ using state variables from the steering system modeling; and
    controlling a difference between the driver steering wheel torque $T_{driver}$ calculated from the steering system model and a torque $T_{sensor}$ sensed by a torque sensor to converge to zero through a controller;
    wherein the steering system model comprises:
        a relationship between a change rate Psw of momentum of a model steering wheel and a model displacement angle qu of a torsion bar, the model steering wheel and the model displacement angle being from the state variables in the steering system modeling; and a relationship between the driver steering wheel torque and the torque sensed by the torque sensor, wherein the change rate Psw of momentum of the model steering wheel and the model displacement angle qu of the torsion bar are used in order to calculate the driver steering wheel torque, wherein the change rate Psw of momentum of a steering wheel is described by $$\dot{P}_{sw} = T_{driver} - q_u \cdot k_u - b_u \cdot \frac{P_{sw}}{J_{sw}} + b_u \cdot gG \cdot \omega_m,$$

where $T_{sw}$ is steering wheel torque [=Driver torque (Tdriver)], qu is displacement angle (or torsion angle) of a torsion bar, $k_u$ is rigidity of the torsion bar, $b_u$ is compliance (or damping constant) of a steering column, $J_{sw}$ is inertia of a steering wheel, gG is a gear ratio of a reducer, and $\omega_m$ is an angular speed of a motor.

2. The method of claim 1, wherein the displacement angle $q_u$ of a torsion bar is described by $$\dot{q}_u = \frac{P_{sw}}{J_{sw}} - gG \cdot \omega_m,$$

3. The method of claim 1, wherein the driver steering wheel torque is calculated by $$T_{driver} - q_u \cdot k_u = \dot{P}_{sw} + b_u\left(\frac{P_{sw}}{J_{sw}} + gG \cdot \omega_m\right),$$

where $T_{driver}$ is driver steering wheel torque and $q_u \cdot k_u$ is torque sensed by the torque.

4. A method of operating a vehicle, the method comprising:
sensing a sensed torque based on a driver interaction with a steering wheel that is part of an electric power steering system, the sensed torque being sensed using a torque sensor;
calculating driver steering wheel torque using state variables of a steering system model based on the electric power steering system; and
controlling a difference between the driver steering wheel torque calculated from the steering system model and sensed torque sensed by the torque sensor to converge to zero through a controller, wherein the steering system model comprises:
a relationship between a change rate Psw of momentum of a steering wheel and a displacement angle qu of a torsion bar, both from the state variables in the steering system modeling; and
a relationship between the driver steering wheel torque and the torque sensed by a torque sensor, wherein the change rate Psw of momentum of the steering wheel and the displacement angle qu of the torsion bar are used in order to calculate the driver steering wheel torque,
wherein the change rate of momentum Psw of a steering wheel is described by $$\dot{P}_{sw} = T_{driver} - q_u \cdot k_u - b_u \cdot \frac{P_{sw}}{J_{sw}} + b_u \cdot gG \cdot \omega_m,$$

where $T_{driver}$ is the driver steering wheel torque, $q_u$ is the displacement angle (or torsion angle) of a torsion bar, $k_u$ is rigidity of the torsion bar, $b_u$ is compliance (or damping constant) of a steering column, $J_{sw}$ is inertia of a steering wheel, gG is a gear ratio of a reducer, and $\omega_m$ is an angular speed of a motor.

5. The method of claim 4, further comprising controlling steering of the vehicle based on the controlled difference.

6. The method of claim 4, further comprising constructing the steering system model.

7. The method of claim 4, wherein the displacement angle $q_u$ of a torsion bar is described by $$\dot{q}_u = \frac{P_{sw}}{J_{sw}} - gG \cdot \omega_m,$$

8. The method of claim 4, wherein the driver steering wheel torque is calculated by $$T_{driver} - q_u \cdot k_u = \dot{P}_{sw} + b_u\left(\frac{P_{sw}}{J_{sw}} + gG \cdot \omega_m\right),$$

where $T_{driver}$ is the driver steering wheel torque and $q_u \cdot k_u$ is torque sensed by a torque sensor.

9. A method for estimating steering wheel torque of a vehicle, the method comprising:
modeling a steering system to design an electric power steering system;
generating a mathematical model, wherein the model calculates a driver steering wheel torque $T_{driver}$ using state variables from the steering system modeling; and
controlling a difference between the driver steering wheel torque $T_{driver}$ calculated from the steering system model and a torque $T_{sensor}$ sensed by a torque sensor to converge to zero through a controller,
wherein the steering system model is a relationship between a change rate Psw of momentum of a steering wheel and a displacement angle qu of a torsion bar, both from the state variables in the steering system modeling, and a relationship between the driver steering wheel torque and the torque sensed by a torque sensor, wherein the change rate Psw of momentum of the steering wheel and the displacement angle qu of the torsion bar are used in order to calculate the driver steering wheel torque;
wherein the steering system model is constructed by inducing a change rate $P_{sw}$ of momentum of the steering wheel and a displacement angle $q_u$ of a torsion bar from the state variables in the steering system modeling, and inducing relationship between the driver steering wheel torque and the torque sensed by a torque sensor, using the change rate $P_{sw}$ of momentum of the steering wheel and the displacement angle $q_u$ of a torsion bar in order to calculate the driver steering wheel torque; and
wherein the driver steering wheel torque is calculated by $$T_{driver} - q_u \cdot k_u = \dot{P}_{sw} + b_u\left(\frac{P_{sw}}{J_{sw}} + gG \cdot \omega_m\right)$$

where $T_{driver}$ is driver steering wheel torque, $q_u \cdot k_u$ is torque sensed by a torque sensor, $P_{sw}$ is a change rate of momentum (or moment torque) of a steering wheel, $b_u$ is compliance (or damping constant) of a steering column, $J_{sw}$ is inertia of the steering wheel, gG is a gear ratio of a reducer, and $\omega_m$ is an angular speed of a motor.

10. The method of claim 9, wherein the change rate $P_{sw}$ of momentum of a steering wheel is described by $$\dot{P}_{sw} = T_{driver} - q_u \cdot k_u - b_u \cdot \frac{P_{sw}}{J_{sw}} + b_u \cdot gG \cdot \omega_m,$$

where $q_u$ is displacement angle (or torsion angle) of the torsion bar and $k_u$ is rigidity of the torsion bar.

11. The method of claim 9, wherein the displacement angle $q_u$ of a torsion bar is described by $$\dot{q}_u = \frac{P_{sw}}{J_{sw}} - gG \cdot \omega_m.$$

* * * * *